(12) United States Patent
Chan

(10) Patent No.: US 10,964,835 B2
(45) Date of Patent: Mar. 30, 2021

(54) UNIVERSAL BROADBAND PHOTODETECTOR DESIGN AND FABRICATION PROCESS

(71) Applicant: The Boeing Company, Chicago, IL (US)

(72) Inventor: Eric Y. Chan, Mercer Island, WA (US)

(73) Assignee: The Boeing Company, Chicago, IL (US)

(*) Notice: Subject to any disclaimer, the term of this patent is extended or adjusted under 35 U.S.C. 154(b) by 380 days.

(21) Appl. No.: 16/115,609

(22) Filed: Aug. 29, 2018

(65) Prior Publication Data

US 2020/0075791 A1    Mar. 5, 2020

(51) Int. Cl.
| | |
|---|---|
| *H01L 31/108* | (2006.01) |
| *G02B 6/42* | (2006.01) |
| *H01L 31/0203* | (2014.01) |
| *H01L 31/0216* | (2014.01) |
| *H01L 31/0224* | (2006.01) |
| *H01L 31/0232* | (2014.01) |
| *H01L 31/028* | (2006.01) |

(Continued)

(52) U.S. Cl.
CPC .......... *H01L 31/108* (2013.01); *G02B 6/4206* (2013.01); *H01L 31/0203* (2013.01); *H01L 31/028* (2013.01); *H01L 31/02161* (2013.01); *H01L 31/02325* (2013.01); *H01L 31/022408* (2013.01); *H01L 31/035281* (2013.01); *H01L 31/1808* (2013.01); *H01L 31/1868* (2013.01); *G02B 1/11* (2013.01)

(58) Field of Classification Search
CPC . H01L 31/108; H01L 31/1085; H01L 31/102; H01L 31/101; H01L 31/0203; H01L 31/02161; H01L 31/022408; H01L 31/02325; H01L 31/028; H01L 31/035281; H01L 31/03529; H01L 31/1808; H01L 31/1868; G02B 6/4206; G02B 1/11
See application file for complete search history.

(56) References Cited

U.S. PATENT DOCUMENTS

| | | | | |
|---|---|---|---|---|
| 4,005,240 | A * | 1/1977 | Schlacter | H01L 23/291 257/437 |
| 6,380,601 | B1 * | 4/2002 | Ermer | H01L 31/1852 257/440 |

(Continued)

OTHER PUBLICATIONS

Ohashi et al., "Development and applications of a Si nano-photodiode with a surface plasmon antenna," Optoelectronics Materials and Devices, Proc of SPIE, vol. 6352 (2006).

(Continued)

*Primary Examiner* — John R Lee
(74) *Attorney, Agent, or Firm* — Ostrager Chong Flaherty & Broitman P.C.

(57) ABSTRACT

A broad-spectral-bandwidth photodetector designed for use with all types of optical fibers used in different avionics networks and sensors and a process for fabricating such photodetectors. A Schottky barrier photodetector is provided that includes germanium, which has a broad spectral response to light in the ultraviolet to near-infrared range (220 to 1600 nm). The provision of a photodetector having a broad spectral response avoids the use of multiple different types of photodetectors and receivers in an avionics platform with different optical fiber networks and sensors.

20 Claims, 11 Drawing Sheets

(51) Int. Cl.
*H01L 31/0352* (2006.01)
*H01L 31/18* (2006.01)
*G02B 1/11* (2015.01)

(56) References Cited

U.S. PATENT DOCUMENTS

| | | | |
|---|---|---|---|
| 7,048,449 B2* | 5/2006 | Frojdh | G02B 6/32 |
| | | | 385/88 |
| 7,359,592 B2 | 5/2008 | Truong | |
| 7,965,913 B2 | 6/2011 | Chan et al. | |
| 8,554,032 B2 | 10/2013 | Koshinz et al. | |
| 9,297,970 B1 | 3/2016 | Chan et al. | |
| 2003/0230761 A1* | 12/2003 | Morrison | H01L 31/109 |
| | | | 257/184 |
| 2004/0208442 A1* | 10/2004 | Shi | G02B 6/327 |
| | | | 385/34 |
| 2007/0170536 A1* | 7/2007 | Hsu | H01L 31/1055 |
| | | | 257/458 |
| 2007/0227589 A1* | 10/2007 | Posthuma | H01L 31/1808 |
| | | | 136/261 |
| 2009/0016678 A1* | 1/2009 | Kawamura | G02B 6/4214 |
| | | | 385/33 |
| 2009/0060518 A1* | 3/2009 | Wang | G02B 6/4204 |
| | | | 398/135 |
| 2009/0154872 A1* | 6/2009 | Sherrer | G02B 6/4248 |
| | | | 385/14 |
| 2010/0116327 A1* | 5/2010 | Cornfeld | H01L 31/078 |
| | | | 136/255 |
| 2015/0037046 A1 | 2/2015 | Chan et al. | |
| 2016/0085027 A1 | 3/2016 | Chan et al. | |
| 2016/0307939 A1* | 10/2016 | Wang | H04B 10/6971 |
| 2017/0051883 A1* | 2/2017 | Raring | H01S 5/02224 |
| 2018/0180829 A1* | 6/2018 | Gudeman | B81B 7/007 |
| 2018/0198256 A1* | 7/2018 | Bessette | H01S 5/3086 |
| 2018/0247968 A1* | 8/2018 | Na | G01S 7/4914 |
| 2019/0019899 A1* | 1/2019 | Wang | H01L 31/02327 |
| 2019/0162519 A1* | 5/2019 | Huang | H01L 31/0232 |
| 2019/0323663 A1* | 10/2019 | Rudy | H01S 5/005 |
| 2020/0075791 A1* | 3/2020 | Chan | H01L 31/035281 |
| 2020/0232611 A1* | 7/2020 | Raring | H01S 5/00 |
| 2020/0313029 A1* | 10/2020 | Chen | H01L 31/02161 |

OTHER PUBLICATIONS

Khurelbaatar et al., "A Comparative Study of IR Ge Photodiodes with a Schottky Barrier Contact and Metal-Semiconductor-Metal Structure," J. Korean Physical Society, vol. 65, No. 12, Dec. 2014, pp. 2100-2106.

Kim et al., "A high-speed InP-based InxGa1-xAs Schottky barrier infrared photodiode for fiber-optic communications," J. Applied Physics, vol. 64, No. 11, Dec. 1, 1988, pp. 6536-6540.

Dutta et al., "Frequency response of a resonant cavity encapsulated germanium-on-silicon Schottky photodiode," IET Circuits, Devices and Systems, vol. 2, No. 1, (2008), pp. 128-132.

* cited by examiner

UNIVERSAL BROADBAND PHOTODETECTOR DESIGN AND FABRICATION PROCESS

BACKGROUND

The technology disclosed herein generally relates to fiber optic networks that enable communication between electrical components. Fiber optic networks have the advantages of higher speed, lower weight and electromagnetic interference immunity over copper networks. Many models of commercial airplanes have fiber optic networks for size, weight and power reduction.

Optical networking using plastic optical fiber (POE) has advantages over copper wiring in weight, size, bandwidth, power, and electromagnetic immunity. Plastic optical fiber has advantages over glass optical fiber (GOF) in ease of handling, installation and maintenance. Using POF may result in appreciable weight savings. The weight savings may be significant for networks onboard vehicles, such as airplanes, where the weight savings may result in reduced fuel consumption and lower emissions.

Before POF networks can fully replace GOF networks, the legacy avionics systems using GOF networks will also be used in many old and new models of commercial airplanes. Glass optical fiber has minimum loss at wavelengths of 1550 nm. Glass optical fiber also has minimum dispersion at 1300 nm. Short distance multi-mode glass optical fiber networks also use an 850-nm wavelength because the widely available, mature and low-cost vertical cavity surface-emitting laser transmitter operates at a wavelength of 850 nm. Therefore, some legacy avionics GOF networks operate at 850 nm, 1300 nm and 1550 nm. These legacy GOF networks will co-exist with POF networks in many airplane systems.

The existing solution is to use different photodetectors for different fiber optic networks or sensors. For example, for low-data-rate POF networks (e.g., a controller area network (CAN) bus) which use POF made of poly(methyl methacrylate), a silicon photodetector is used for the receiver operation in the visible wavelength range (450, 550 and 650 nm). For high-speed gigabit POF networks (e.g., ARINC 664, gigabit Ethernet), an InGaAs photodetector is used for receiver operation at the 1200 to 1550 nm wavelength range. For GOF networks, a GaAs photodetector is used at a wavelength of 850 nm and an InGaAs photodetector is used for either 1300-nm- or 1550-nm-wavelength networks. The drawbacks of the foregoing solution are manifold.

First, in an airplane system which has different fiber optic networks and sensors, different receivers are required. The supply, storage and installation of parts for multiple receivers increases the production cost of the airplane avionics system.

Second, currently there is no commercial-off-the-shelf (COTS) photodetector having broadband spectral characteristic that meet the broad spectral range and high quantum efficiency requirements of all fiber optic (POF and GOF) networks in future commercial airplanes avionics systems. For example, some COTS receivers have photodetector sizes which are not optimized for coupling with large-diameter POF. As a result, a POF network with mismatched photodetector sizes has lower receiver sensitivity, which in turn provides a lower optical link margin and a short link distance.

Third, some COTS POF receivers have a photodetector structure which causes the receiver to generate extra optical pulses at a lower than expected optical power level. This problem is referred to herein as "arbitrary pulse phenomena" (APP). As a result of the APP problem, the dynamic range of the fiber optic networks is reduced.

SUMMARY

The technology disclosed in some detail below is designed to alleviate the above-described problems. A very broad spectral bandwidth photodetector design and fabrication process for all types of optical fibers used in different avionics networks and sensors is disclosed in some detail below. The solution proposed herein provides a Schottky barrier photodetector that includes germanium (hereinafter "germanium Schottky barrier photodetector"), which has a broad spectral response to light in the ultraviolet to near-infrared range (220 to 1600 nm). The provision of a photodetector having a broad spectral response avoids the use of multiple different types of photodetectors and receivers in an avionics platform with different optical fiber networks and sensors.

Germanium has a broad spectral response which covers the wavelength range from 220 to 1600 nm. This spectral range spans all minimum loss wavelengths for all types of POF and GOF networks or sensors, including low-data-rate POF, GbPOF, single-mode GOF and multi-mode GOF networks. In addition, the structure of the germanium Schottky barrier photodetector disclosed herein is designed to maximize the quantum efficiency of the photodetector. The Schottky barrier photodetector structure in accordance with some embodiments also includes a thick active layer and optimized photodetector size and depletion width to eliminate the APP problem produced by the photodetector in some COTS receivers. The Schottky barrier photodetector disclosed herein has low fabrication cost as compared to silicon and InGaAs photodetectors.

In accordance with some embodiments, the germanium Schottky barrier photodetector is designed to have the following features: (a) a metal layer thickness and an epitaxial layer thickness which are optimized for use in different types of fiber optic networks and sensors; (b) low background doping density in the epitaxial layer; (c) an optimized detection area for all avionics fiber optic networks; and (d) a mesa structure with dielectric passivation layer to reduce dark current, which is the main source of shot noise in a fiber optic receiver. By lowering the shot noise, the receiver sensitivity is enhanced. The germanium Schottky barrier photodetector may also be used in non-aerospace telecommunication networks.

Although various embodiments of a germanium Schottky barrier photodetector and a process for fabricating such a photodetector will be described in some detail below, one or more of those embodiments may be characterized by one or more of the following aspects.

One aspect of the subject matter disclosed in detail below is a photodetector comprising: a substrate made of doped germanium; a mesa structure made of doped epitaxial germanium grown on top of the substrate, wherein a doping density of the doped epitaxial germanium is less than a doping density of the doped germanium; a metal film made of metal deposited on top of the mesa structure; a metal pad made of metal deposited on top of the mesa structure and in contact with the film; an ohmic contact layer made of metal deposited on a bottom of the substrate; an anti-reflective coating deposited on the film; and a dielectric passivation layer that covers exposed surfaces of the mesa structure. The metal film and metal pad are made of a metal selected from the following group: gold, silver, aluminum, copper and indium. The metal film and the mesa structure are configured to form a depletion region in the mesa structure and adjacent to the metal film. When a proper reverse bias voltage is applied by a voltage source during impingement of photons on the metal film, all the photons that penetrate into the epitaxial layer are absorbed inside the depletion region.

Another aspect of the subject matter disclosed in detail below is a fiber optic device comprising: an optical fiber having an end; a metal case comprising a base, a lens cap attached to the base and a glass ball lens installed in an opening on a top of the lens cap; and a photodetector disposed inside the metal case, the photodetector comprising a substrate made of doped germanium, a mesa structure made of doped epitaxial germanium grown on top of the substrate, a doping density of the doped epitaxial germanium being less than a doping density of the doped germanium substrate, a metal film made of metal deposited on top of the mesa structure, a metal pad made of metal deposited on top of the mesa structure and in contact with the film, and an ohmic contact layer made of metal deposited on a bottom of the substrate. The optical fiber, glass ball lens and metal film are aligned.

A further aspect of the subject matter disclosed in detail below is a method for fabricating a photodetector, the method comprising: polishing and lapping a doped germanium wafer until a germanium substrate having a thickness in the range of 100 to 150 microns is formed; growing a doped germanium epitaxial layer about 15 microns thick on top of the germanium substrate; depositing an ohmic contact metal layer on a bottom of the germanium substrate; depositing a metal film and a metal pad on top of the germanium epitaxial layer such that the metal pad is in contact with the metal film; forming a mesa structure by removing some of the germanium epitaxial layer; depositing a dielectric passivation layer on exposed surfaces of the mesa structure; and depositing an anti-reflective coating on top of the metal film.

Other aspects of germanium Schottky barrier photodetectors and processes for fabricating such photodetectors are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams briefly described in this section are drawn to scale.

Reference will hereinafter be made to the drawings in which similar elements in different drawings bear the same reference numerals.

DETAILED DESCRIPTION

Illustrative embodiments of germanium Schottky barrier photodetectors are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
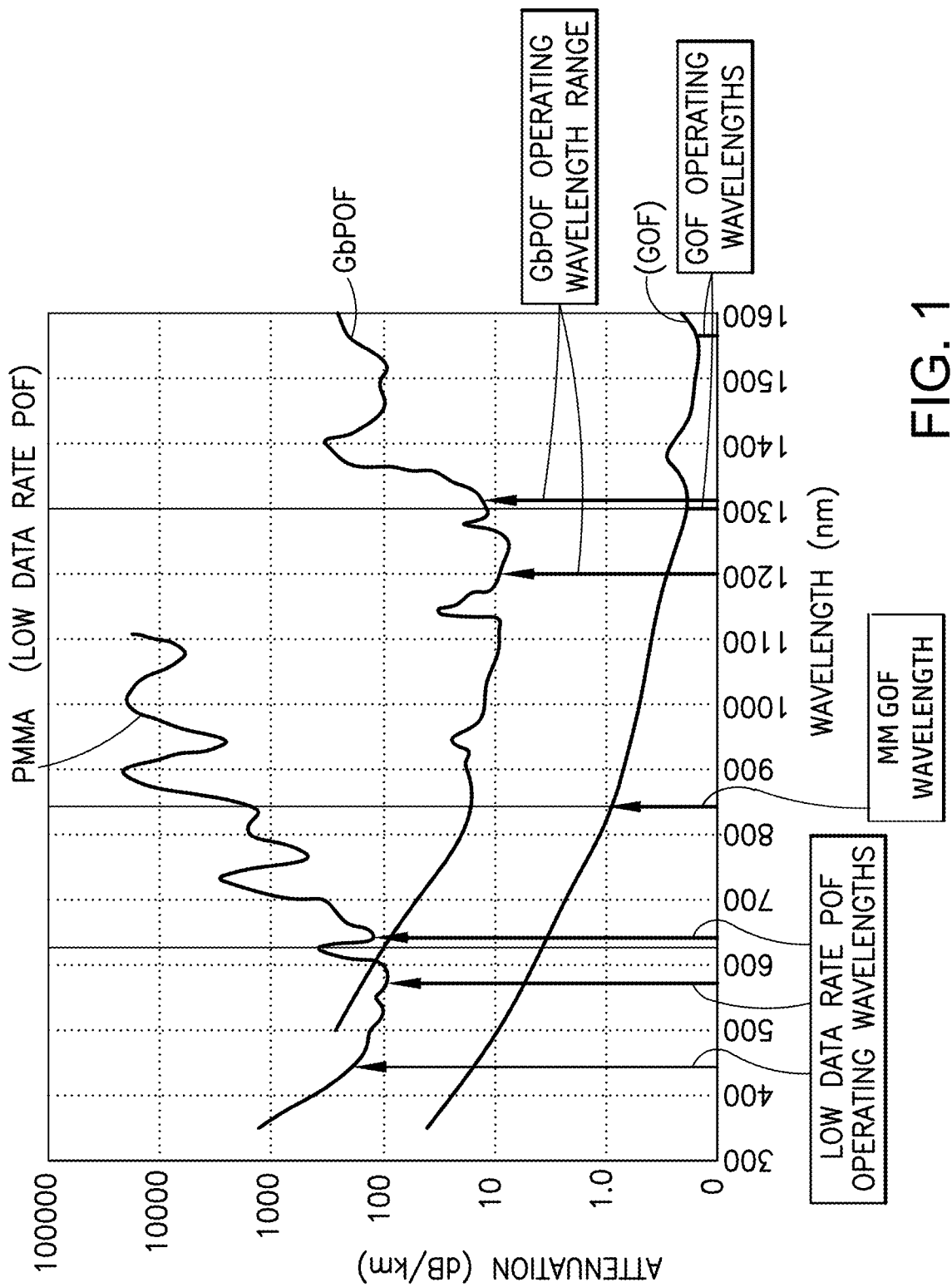
FIG. 1 is a graph showing the attenuation versus wavelength for low-data-rate POF, GbPOF and GOF.

In the future, there will be different POF fibers to be used in commercial airplane avionics networks and sensor systems. For low-data-rate networks such as the CAN bus, ARINC 629 data bus, or fuel quality indicator sensor, the low-date-rate POF are large-diameter (1 mm) optical fibers made of PMMA, but for high-data-rate networks, GbPOF will be used. GbPOF is a per-fluorinated polymer with 500-micron cladding and a 55-micron core diameter. The low-data-rate POF and the high-data-rate GbPOF have different operational wavelengths, because the PMMA and per-fluorinated polymer have different optical loss characteristics. FIG. 1 shows the attenuation versus wavelength for low-data-rate POF, GbPOF and GOF. These differences in minimum attenuation wavelengths in this spectral characteristic have in the past required the use of different receivers for low-data-rate POF, GbPOF and GOF networks.

The legacy GOF networks are expected to co-exist with POF networks in many airplane avionics systems. GOF networks typically have operational wavelengths at 850, 1300 and 1550 nm. Currently there is no photodetector that has the broad spectral bandwidth for all low-data-rate POF, GbPOF and GOF networks. For airplane systems that have low-data-rate POF, GbPOF and GOF networks, these networks are large-scale networks using a large number of receivers. Different receivers used in an airplane networks would increase installation and part maintenance cost for airplane production. A universal photodetector design that has a broad spectral optical response would enable all the low-data-rate POF, GbPOF and GOF networks and sensors to use the same receiver, thereby greatly reducing the installation and maintenance cost in airplane production, especially in commercial airplanes where the scale of networks is large with hundreds of network nodes.

The optical response of a fiber optic photodetector depends on the material selection of the photodetector. For GOF networks, the photodetector is typically made of InGaAs III-V compound material. This material is also feasible for making photodetectors for GbPOF networks. But the COTS InGaAs photodetectors for GOF networks are very small in photodetector surface area, being designed to match the small diameter of single-mode or multi-mode GOF. For examples, single-mode GOF has a core diameter of about 8 microns, whereas multi-mode GOF has typical diameters of 50 and 62.5 microns. Typically GOF photodetector surface diameters are no more than 75 microns. While these small-diameter InGaAs photodetectors may be applicable for the GbPOF networks because the diameter of GbPOF is about 55 or 85 microns, which closely match the diameters of multi-mode GOF, but for low-data-rate POF, which has core diameter of about 1 mm, the GOF InGaAs photodetector is too small. Besides the diameter constraint, the low-data-rate POF operates in the visible wavelength range where the InGaAs photodetector does not have good optical response. Commercial-off-the-shelf photodetectors for low-data-rate POF networks are made of silicon, which does not have a good optical response for the near-infrared wavelength range in which GOF and GbPOF operate.

Figure 2:
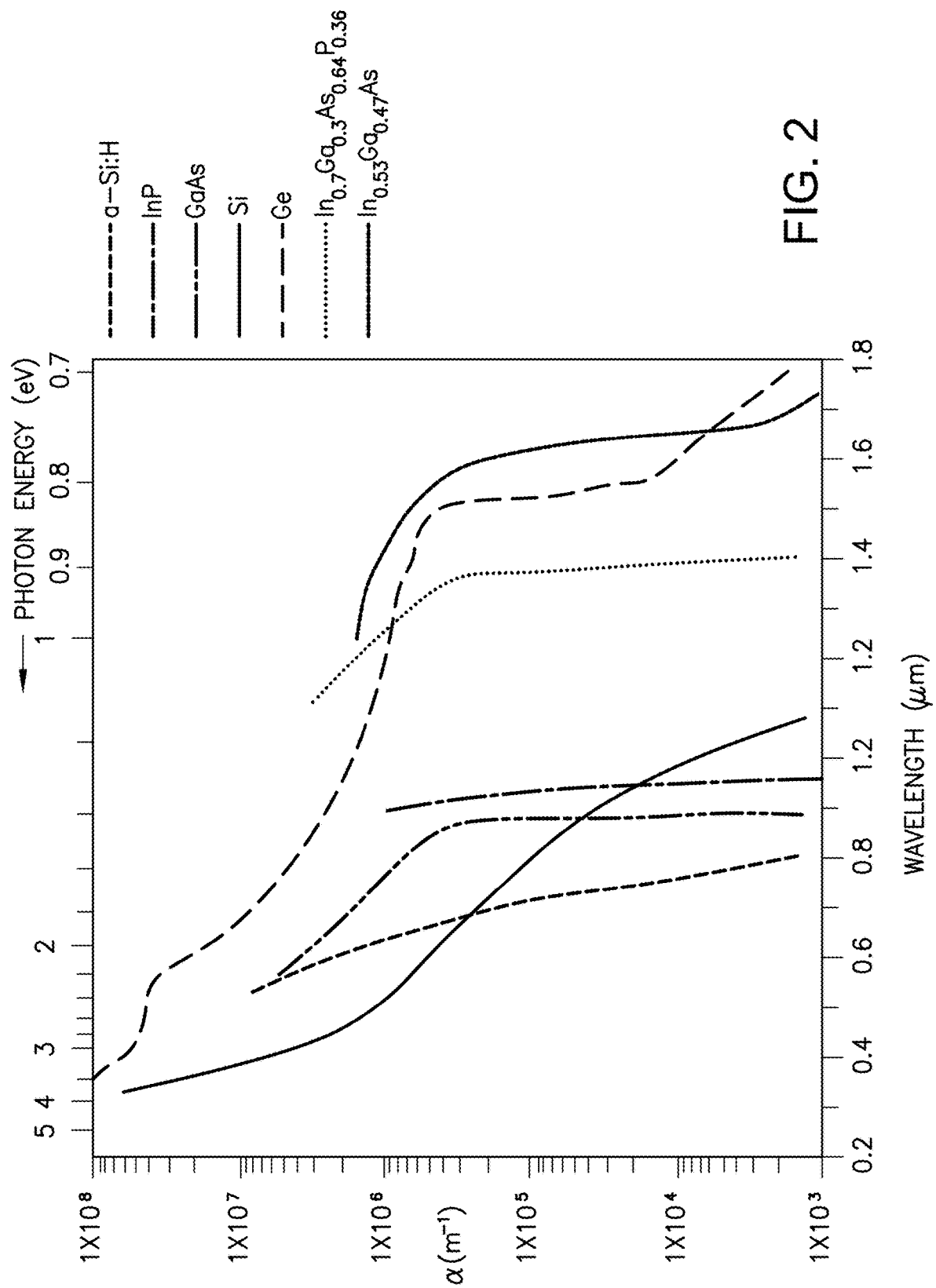
FIG. 2 is a graph showing the absorption coefficient versus wavelength for different semiconductor materials.

FIG. 2 shows the optical absorption coefficient versus wavelength for silicon (Si), germanium (Ge) and InGaAs material. This graph shows that Si and InGaAs cannot cover the wavelength range from 0.4 micron (400 nm) to 1.55 micron (1550 nm) in which for low-data-rate POF, GbPOF and GOF systems operate. Similar problems exist for indium phosphide (InP) and gallium arsenide (GaAs), both of which do not have a good broadband optical absorption coefficient for the same wavelength range. But germanium has a good absorption coefficient that covers wavelengths from 400 to 1550 nm.

Based on the above analysis, germanium was selected as the semiconductor material for a broadband photodetector designed for use in low-data-rate POF, GbPOF and GOF avionics networks and sensors. More specifically, the germanium Schottky-barrier photodetector has an optical detection diameter that is optimized for all optical fiber networks and sensors, including low-date-rate POF, GbPOF and GOF avionics networks and sensors.

Figure 3:
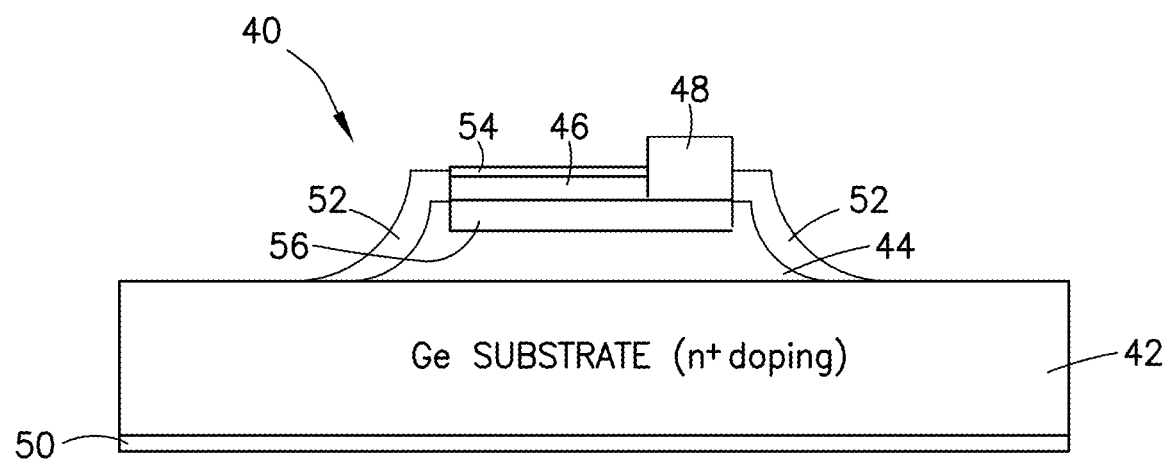
FIG. 3 is a diagram showing the structure of a germanium Schottky barrier photodetector in accordance with one embodiment.

The structure of a germanium Schottky-barrier photodetector 40 in accordance with one embodiment is shown in FIG. 3. The germanium Schottky-barrier photodetector 40 includes a germanium substrate 42 having n$^+$-type doping and a mesa structure 44 (the active layer) consisting of an epitaxial overlayer of crystalline germanium having n-type doping. As used herein, the term "mesa structure" refers to a structure having a flat top (upper surface) and a peripheral side surface that intersects the flat top along a peripheral edge having a closed contour.

The germanium Schottky-barrier photodetector 40 further includes a metal film 46 and a metal pad 48 deposited in respective continuous areas on the upper surface of the mesa structure 44. The metal film 46 and metal pad 48 differ in thickness and in area, as will be described in more detail below. An anti-reflective coating 54 is deposited on the metal film 46. A dielectric passivation layer 52 is deposited such that exposed surfaces on the periphery of the mesa structure 44 are covered. The photo-detection surface area provided by the metal film 46 is covered by the anti-reflective coating 54, not by the dielectric passivation layer 52.

Many different metals may be used to make the germanium Schottky-barrier photodetector 40. Based on the theory of device physics, all metal contacts to germanium will make a photodiode. Gold is preferred because it has better environmental durability (no corrosion due to humidity, salt and fog conditions), gold is a better material for the device fabrication process because it is easier to deposit compared to other metals, and for packaging, gold is better for wire bonding. Based on theory, however, silver, aluminum, copper and indium are good candidates to substitute for gold. All calculations discussed below assume that the metal film 46 and metal pad 48 are made of gold.

Referring again to FIG. 3, the germanium Schottky-barrier photodetector 40 further includes an ohmic contact metal layer 50 which is deposited on the bottom of the germanium substrate 42. The ohmic contact is a non-rectifying electrical junction between two conductors that theoretically has a linear current-voltage curve in accordance with Ohm's law. Low-resistance ohmic contacts are used to allow charge to flow easily in both directions between two conductors, without blocking due to rectification or excess power dissipation due to voltage thresholds. In contrast, the Schottky barrier is a rectifying junction or contact that does not have a linear current-voltage curve. As used herein, the term "ohmic contact" refers to an ohmic contact of a metal to a semiconductor.

FIG. 3 also shows a depletion region 56 that may be formed in the active layer below the metal film 46. The width of the depletion region varies when a voltage is applied across the metal pad 48 and the ohmic contact metal layer 50. As used herein, the term "depletion region" means an insulating region within a doped semiconductor material where the majority charge carriers have been diffused away to form a region with high electric field.

Some features and characteristics of the germanium Schottky-barrier photodetector 40 depicted in FIG. 3 will now be explained, first with reference to the fabrication process partly depicted in FIGS. 4A-4E and then with reference to the physics of the photodetector's operation partly depicted in FIGS. 6 and 7. Thereafter the elimination of the APP problem will be discussed with reference to FIGS. 8A-8C and 9. Lastly the packaging of the germanium Schottky-barrier photodetector 40 for maximum fiber optic coupling efficiency will be described with reference to FIGS. 10 and 11.

Figure 4A:
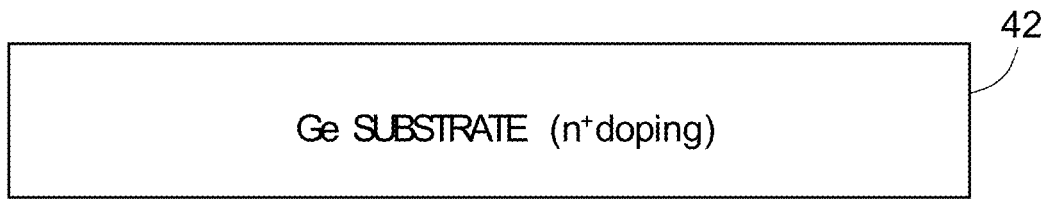
FIGS. 4A through 4E are diagrams showing various steps in a process for fabricating germanium Schottky barrier photodetector of the type depicted in FIG. 3.
Figure 4B:
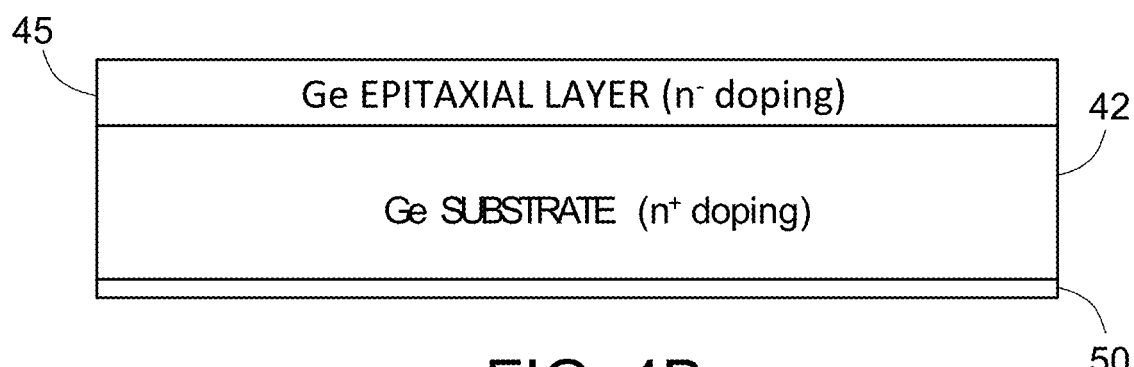

Some steps of a fabrication process in accordance with one embodiment are shown in FIGS. 4A through 4E. As shown in FIG. 4A, the first step involves polishing and lapping a highly doped (n$^+$ type) germanium wafer until a germanium substrate 42 having a thickness in the range of 100 to 150 microns is formed, making sure that both the top side and bottom side of the germanium substrate 42 are clean, smooth and shiny.

The next step includes growing a lightly doped (n$^-$ type) germanium epitaxial layer 45 (shown in FIG. 4B) about 15 microns thick on top of the heavily doped germanium substrate 40. This is accomplished by either a vapor-phase epitaxy or metal-organic chemical vapor deposition process. The germanium epitaxial layer 45 is the main light absorption layer of the germanium Schottky-barrier photodetector 40. Therefore a proper layer thickness and a high-quality epitaxial growth process are desirable for the photodetector design disclosed herein. As should be understood from the foregoing usage of the terms "highly doped" versus "lowly doped", the doping density of the germanium epitaxial layer 45 is much less than the doping density of the germanium substrate 42.

Another step of the fabrication process involves the deposition of an ohmic contact metal layer 50 (see FIG. 4B) on the bottom of the germanium substrate 42. The ohmic contact metal layer 50 is preferably made of indium or other suitable metal contact with a thickness in excess of 1 micron.

Figure 4C:
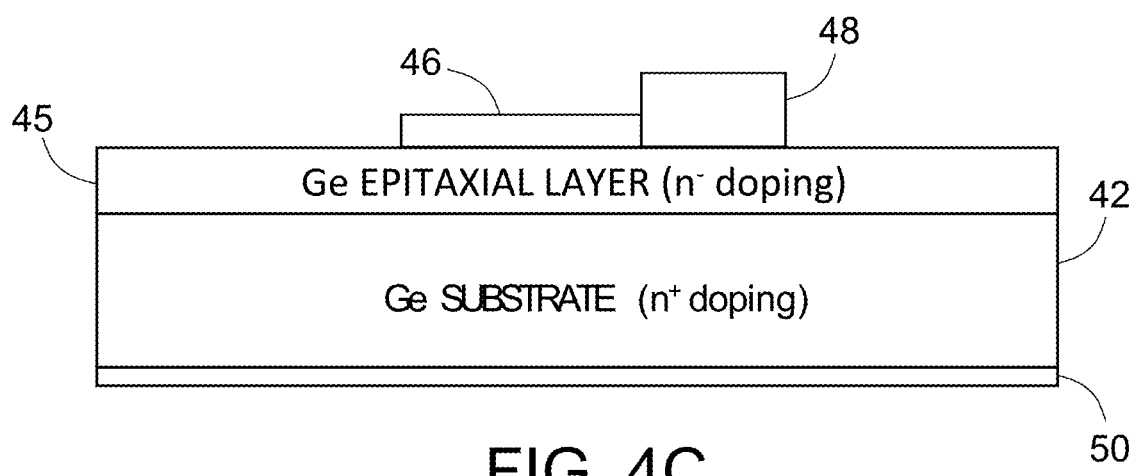

After the germanium epitaxial layer 45 has been deposited on the germanium substrate 42, metal film 46 and metal pad 48 are deposited on top of the germanium epitaxial layer 45. FIG. 4C is a diagram representing a side view of the metal-semiconductor structure resulting from the deposition of metal (preferably gold) on the germanium epitaxial layer 45.

Figure 5:
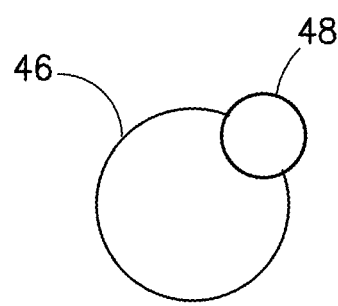
FIG. 5 is a diagram representing a top view of a metal film and a metal pad which are deposited on top of the epitaxial layer in accordance with one embodiment.

As seen in FIG. 5 (which is not drawn to scale), the top surface of the metal film 46 has an area A, while the top surface of the metal pad 48 is smaller than area A. In accordance with one example construction of the germanium Schottky-barrier photodetector 40 in which the metal film 46 and metal pad 48 are made of gold, the metal film 46 may have a diameter in a range of 450 to 600 microns and a thickness of about 50 Angstroms. The metal film 46 forms the rectifying junction for the photodetector. The metal film 46 is a very thin layer to maximize light coupling into the active region of the photodetector. The metal pad 48—which is about 25 microns in diameter with a thickness of about 40 microns for the case of gold—is deposited by a plating process. As seen in FIG. 5, the metal pad 48 is offset to the edge of the metal film 46 so that most of the area of the metal film 46 is exposed to the optical signal from the optical fiber. The metal pad 48 is a much thicker layer for wire bonding; the metal pad 48 also makes electrical contact with the metal film 46 for conducting the photo-generated current.

Figure 4D:
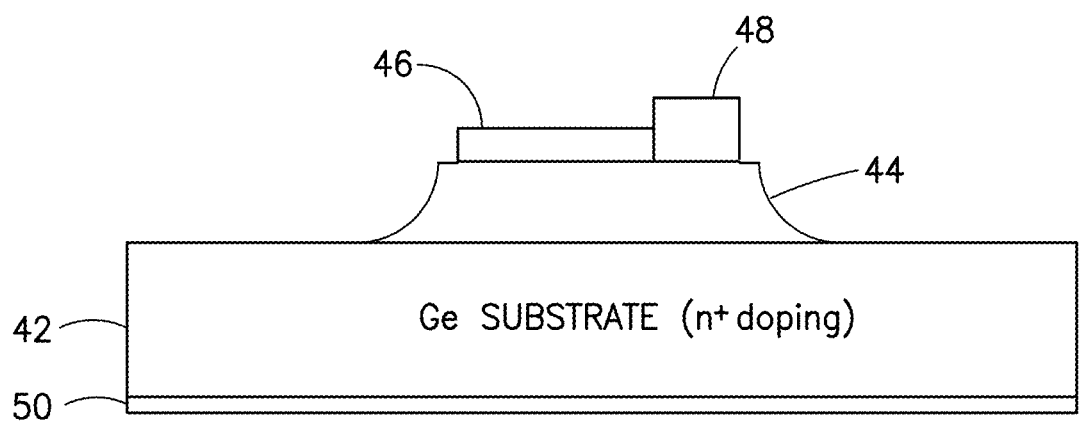

Following the deposition of metal on the top surface of the germanium epitaxial layer 45, a mesa structure 44 (shown in FIG. 4D) is formed by removing some of the germanium epitaxial layer 45 (shown in FIG. 4C). In accordance with one embodiment, the outer peripheral surface of the mesa structure 44 has a concave curved profile, as depicted in FIG. 4D. For example, the geometry of the outer peripheral surface of the mesa structure 44 may be similar to a surface of revolution that would be generated by revolving an arc in three-dimensional space about a vertical axis in the center of the detector. Alternatively, the outer periphery of the mesa structure 44 may be conical. Preferably, the mesa structure 44 has a top surface with a boundary that extends beyond the boundary of the metal structure formed by the metal film 46 and metal pad 48 (shown in FIG. 5). For example, the mesa structure 44 may have a circular top surface with a diameter D of about 600 microns, on which the metal film 46 and metal pad 48 are situated. The mesa structure 44 can be made by a wet chemical or plasma etching process. The purpose of the mesa structure 44 is to reduce the reverse bias dark (or leakage) current of the photodetector.

Figure 6:
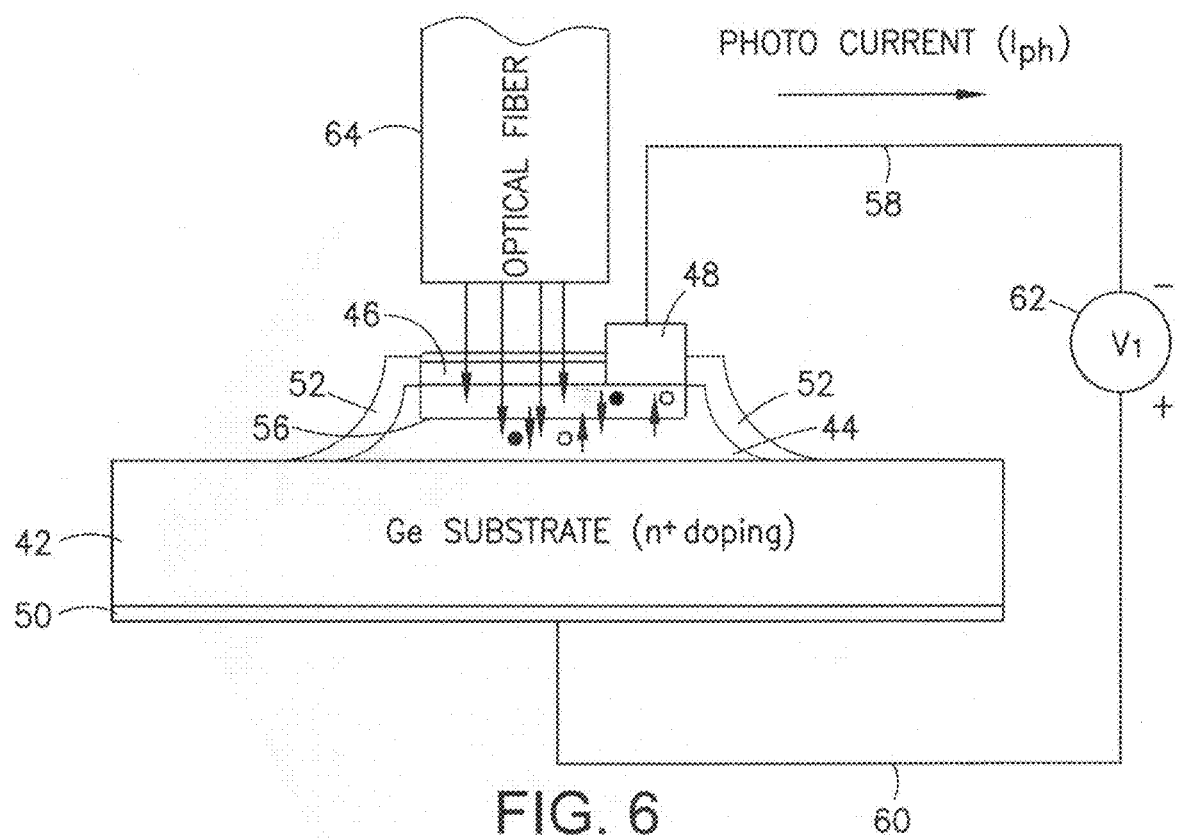
FIG. 6 is a diagram showing a principle of photocurrent generation in a germanium Schottky barrier photodetector of the type depicted in FIG. 3. Electrons are indicated by filled circles (●); holes are indicated by open circles (○).

Following the formation of the mesa structure 44, an anti-reflection coating 50 (see FIG. 4E) is deposited on top of the metal film 46 to reduce the reflection of the optical signal from the optical fiber (not shown in FIGS. 4A-4E, but see optical fiber 64 in FIG. 6). The anti-reflection coating 50 may be made of silicon nitride formed by plasma deposition or high vacuum evaporation or a sputtering process. The thickness of the anti-reflection coating 50 is designed to maximize light coupling from the optical fiber to the active region of the photodetector. The active region is the region inside the mesa structure 44 directly under the metal-germanium (e.g., Au—Ge) junction.

Figure 4E:
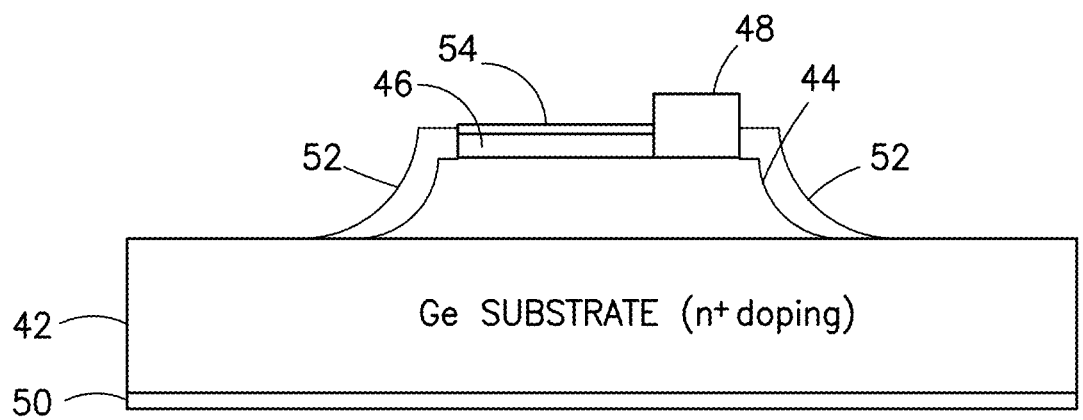

In addition, a passivation layer 52 is deposited on the exposed surface of the mesa structure 44 to reduce the dark (or leakage) current of the photodetector. This layer also provides the physical and environmental protection to the active layer of the photodetector. FIG. 4E is a diagram representing a side view of the metal-semiconductor structure resulting from the deposition of the anti-reflection coating 50 and the passivation layer 52.

The above-described germanium Schottky-barrier photodetector 40 may be fabricated using a photolithography process. Upon completion of the fabrication process, a voltage may be applied across the terminals formed by the metal pad 48 and the ohmic contact metal layer 50 to increase the width of the depletion region 56 below the metal-germanium (e.g., Au—Ge) junction.

The physics of the germanium Schottky-barrier photodetector will now be described briefly with further reference to FIG. 6. As shown in FIG. 6, when the metal film 46 is deposited on top of the epitaxial layer with a mesa structure 44, the depletion region 56 of the photodetector is formed. The depletion region 56 is where light from an optical fiber 64 is absorbed and where electron-hole pairs are generated. When an electrical circuit is made between the metal pad 48 and the ohmic contact metal layer 50, the flow direction of the election-hole pairs is opposite to each other.

More specifically, a reverse bias voltage $V_1$ is applied by electrically connecting the negative terminal of a voltage source 62 to the metal pad 48 by means of an electrical conductor 58 and electrically connecting the positive terminal of the voltage source 62 to the ohmic contact metal layer 50 by means of an electrical conductor 60. As a result, a photo-current $I_{ph}$ (indicated by the horizontal arrow in FIG. 6) is generated on the external circuit formed by electrical conductors 58 and 60.

The key technical requirement for a good photodetector is to maximize the quantum efficiency of the photo-current generation process. Quantum efficiency is expressed as electrons generated per incident photons and is a measure used to design a photodetector that has the ability to capture the incident photons with minimum loss.

As shown in FIG. 6, when a metal contact (or film) is deposited on top of the Ge epitaxial layer, a depletion region 56 is formed in the portion of the mesa structure 44 directly below the metal film 46. The charge carriers on both sides of the metal-germanium (e.g., Au—Ge) rectifying junction produce a so-called built-in electrical field. The width W (measured in the thickness direction) of the depletion region 56 depends on the doping density $N_d$ of the epitaxial germanium that forms the mesa structure 44 and also the external bias voltage $V_1$ to the photodetector. Lower doping density and higher reverse bias enlarge the depletion width for the photodetector. Lower doping density means higher purity of the epitaxial layer. Ideally a good photodetector should be free of impurity and be labeled as an intrinsic layer. (As used herein, an "intrinsic layer" is a layer of semiconductor material whose properties are essentially those of the pure undoped material.)

The reason the lightly doped epitaxial germanium having the mesa structure 44 is important should be apparent from FIG. 6. The depth of penetration of the photons from the optical fiber 64 depends on the wavelength of the optical signal. When light is coupled into the germanium Schottky-barrier photodetector 40 from the optical fiber 64, photons travel from the surface of the metal film 46 and penetrate into the lower part of the active (epitaxial) layer. Longer-wavelength photons travel deeper than the shorter-wavelength photons. This is indicated by the absorption coefficient versus wavelength relationship shown in FIG. 2. Longer-wavelength photons have a lower absorption coefficient and can travel beyond the depletion region 56, where electron-hole pairs are generated. Electrons are indicated by filled circles (●) in FIG. 6; holes are indicated by open circles (○).

The first parameter of a high-performance photodetector design is the depletion width W of the photodetector. The depletion region 56 of the germanium Schottky-barrier photodetector 40 is also called the high-field region where the junction built-in electric field is highest. A high-performance photodetector needs to absorb all the photons in the depletion region 56 to achieve high speed and high quantum efficiency. This is because the photo-generated charge carriers (electrons) travel with high speed inside the depletion region 56. Photo-generated charge carriers (electrons) generated beyond the depletion region 56 will need to travel into the depletion region 56 by a diffusion process and then be swept by the electric field in the depletion region 56 to generate the photo-current $I_{ph}$. This process lowers the speed of response of the photodetector and causes the receiver APP problem which will be explained in more detail below.

Figure 7:
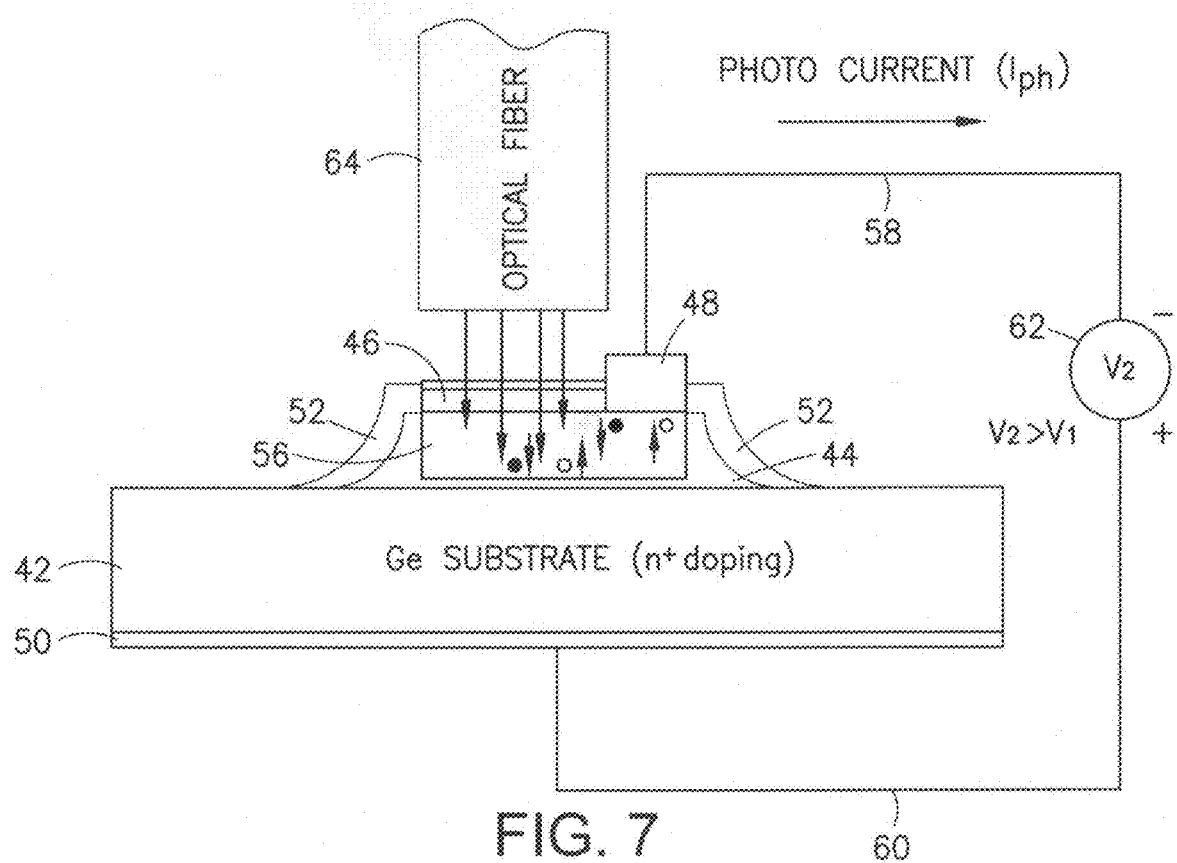
FIG. 7 is a diagram showing a principle of depletion width optimization in the germanium Schottky barrier photodetector depicted in FIG. 6. Electrons are indicated by filled circles (●); holes are indicated by open circles (○).

As shown in FIG. 7, a high-performance photodetector design should provide a large depletion width W to confine and absorb all the photons coming from the optical fiber 64. The depletion width W depends on the doping density $N_d$ and the reverse bias voltage V on the photodetector. A lower doping density (or higher purity) in the active layer and a higher reverse bias voltage $V_2$ ($V_2 > V_1$) will increase the depletion width W as shown in FIG. 7. The germanium Schottky-barrier photodetector design parameters proposed herein provide an optimized depletion width for high speed and high quantum efficiency. The relationship of the depletion width W with doping density $N_d$ and bias voltage V is indicated in Eqs. (1) to (3):

$$W = \sqrt{\frac{2\varepsilon\varepsilon_o\left(V_{bi} - V - \frac{KT}{q}\right)}{qN_d}} = \sqrt{\frac{W_1}{W_2}} \quad (1)$$

$$W_1 = 2\varepsilon\varepsilon_o\left(V_{bi} - V - \frac{KT}{q}\right) \quad (2)$$

$$W_2 = qN_d \quad (4)$$

where ε is the dielectric constant of Ge=16; $\varepsilon_0$ is the vacuum permittivity=8.85418E-14 F/cm; $V_{bi}$ is the built-in voltage (or potential) of the Ge Schottky-barrier detector; V is the bias voltage of the Ge Schottky-barrier detector; $N_d$ is the background doping density of the active layer (in mesa structure 44) of the Ge Schottky-barrier detector; K is the Boltzmann Constant=1.38066E-23 J/° K; T is the temperature in degrees Kelvin (° K); q is the charge of an electron=1.60218E-19 C; and KT/q is the thermal voltage at 300° K (room temperature)=0.0259 V.

The second photodetector parameter for an optimized photodetector is low capacitance. The capacitance of the photodetector increases with the photodetector surface area A and reduces with lower doping density. For a universal fiber optic photodetector that needs to couple to optical fibers having diameters ranging from 8 microns to 1 mm, a photodetector surface area having a diameter of 550 microns is proposed herein, because with this diameter, the 1-mm POF can be coupled with a lens packaging, as will be described in some detail below. The photodetector capacitance design is shown in Eq. (4):

$$C = \frac{\varepsilon\varepsilon_o A}{w} \quad (4)$$

where A is the area of the Ge Schottky-barrier detector.

The third parameter of an optimized photodetector design is the dark current of the photodetector. The dark current of the photodetector is the main source of short noise for the receiver electronic circuit that interfaces with the photodetector. The dark current of the photodetector is proportional to the photo-detection area A of the photodetector, the material of photodetector and the type of electrical junction of the photodetector. The germanium Schottky-barrier photodetector 40 disclosed herein has a diameter that minimizes the dark current and provides a surface area which maximizes the photon absorption of different-sized optical fibers used in avionics applications. The mesa structure 44 made of n-doped epitaxial germanium eliminates the additional dark current due to surface leakage which would occur in a planar photodetector structure. The relationship of dark current to the photo-detection area A and the photodetector junction parameters is shown in Eq. (5):

$$I_d = AA^*T^2\exp\left(-\frac{q\varphi_b}{KT}\right) \quad (5)$$

where A* is the effective Richardson Constant; and $\varphi_b$ is the barrier height of the Ge Schottky-barrier detector. The value of the effective Richardson constant (A*) is a function of metal film thickness, type of metal, method of deposition, and condition of the semiconductor prior to metal deposition. The effective Richardson constant A*, which affects the dark current, is preferably in the range of 128 to 135 A/cm²/° K². One of the primary characteristics of a Schottky barrier is the Schottky barrier height, denoted by $\varphi_b$. The value of $\varphi_b$ depends on the combination of metal and semiconductor and is preferably in the range of 0.54 to 0.64 V.

The fourth parameter for a high-performance photodetector design is the quantum efficiency. The relationship of quantum efficiency to photo-generated current is shown in Eq. (6):

$$I_{ph} = \eta_{QE}P_i\left(\frac{\lambda}{1.24}\right) \quad 6)$$

where $\eta_{QE}$ is the quantum efficiency of the Ge Schottky-barrier detector; $P_i$ is the incident power on the Ge Schottky-barrier detector; and λ is the wavelength of incident photons on the Ge Schottky-barrier detector (in microns).

Higher quantum efficiency produces higher photo-generated current, which in turn produces higher receiver sensitivity. The photodetector area and packaging design disclosed herein provide the maximum quantum efficiency for diverse optical fiber sizes from 8-μm to 1-mm diameters. The design equations and parameters for a Schottky-barrier detector can be found in "Physics of Semiconductor Device," Chapter 5: Metal-Semiconductor Contacts, by S. M. Sze, pp. 245-311, publisher: John Wiley and Son, 1981.

The detector diameter determines the size of the photodetector. It also affects the photo-response of the detector. Therefore, the diameter provides the optimized dark current, capacitance and photo-response of the detector. Out of these three characteristics, capacitance and dark current are better with a smaller-detector diameter, but photo-response of the detector needs a large-diameter detector. A detector diameter may be calculated that optimizes these three characteristics. The range of suitable detector diameter is from 450 to 600 microns.

The above-described optimal design also seeks to address the APP problem in some COTS POF photodetectors, which is due to the depletion width within the active region of the photodetector being too small. As shown in FIG. 6, if the depletion width is too small, there will be a large amount of photons absorbed outside the depletion region 56. The photo-generated charge carriers (electrons) will need to go through a diffusion process before reaching the high-field depletion region. This process creates a "diffusion tail" to the optical response pulse of the photodetector when the receiver is designed with an automatic gain control (AGC) circuit that generates an electrical pulse at a certain level of optical power and within a certain response time period after the first optical pulse from the photodetector occurs. The purpose of AGC is to increase the dynamic range of a receiver. The AGC automatically reduces the gain of a receiver if the input optical signal is higher than a certain power level. The AGC increases the gain of the receiver if the input optical signal is below a specified optical power level. For example, in accordance with one burst mode optical receiver design, the AGC is required to detect a signal at 30 dB below the start of the optical pulse within a specified time period after the optical pulse occurs. If the photodetector optical response has incurred a large "diffusion tail", it causes the receiver to generate an unintended optical response pulse. These unintended optical pulses may cause bit errors in the receiver. The physical problem of APP is shown in FIGS. 8A-8C and 9. The design of the Ge Schottky-barrier photodetector disclosed herein eliminates this APP problem in avionics system applications.

Figure 8A:
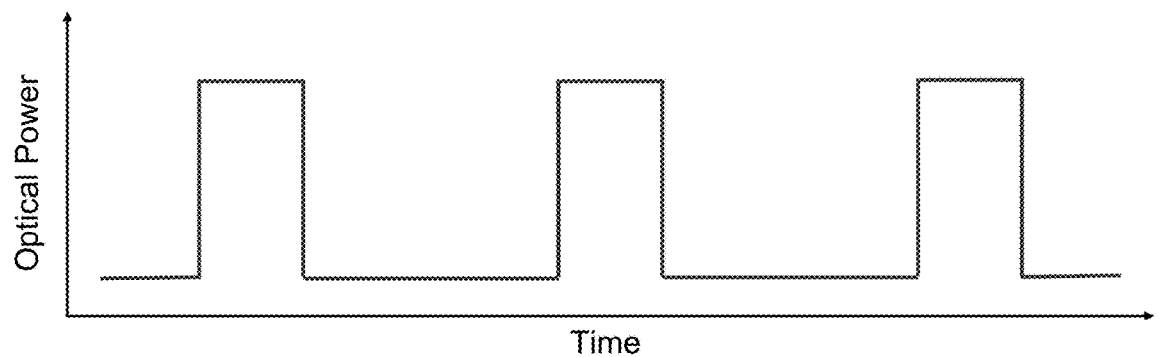
FIG. 8A is a graph showing the optical power received from an optical fiber by a typical photodetector as a function of time.
Figure 8B:
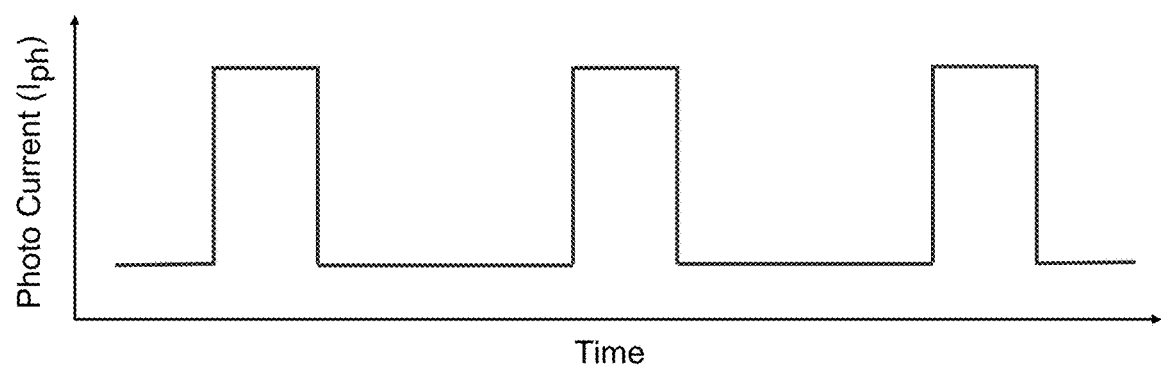
FIG. 8B is a graph showing a series of photo-generated current pulses produced by a typical photodetector as a function of time if all photons are absorbed within the depletion region.
Figure 8C:
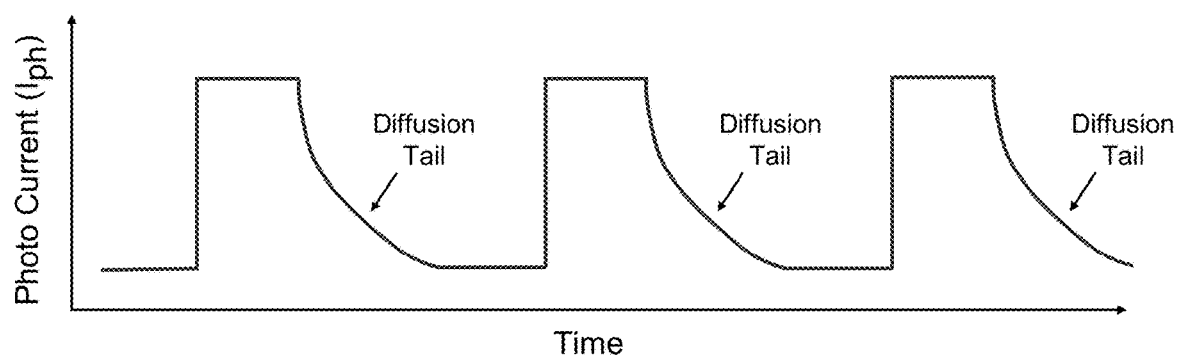
FIG. 8C is a graph showing a series of photo-generated current pulses produced by a typical photodetector as a function of time if photons are absorbed outside the depletion region, in which case the response to an optical pulse may have a diffusion tail.

FIG. 8A shows the optical power received from an optical fiber by a typical photodetector as a function of time. FIG. 8B shows a series of photo-generated current pulses produced by a typical photodetector as a function of time if all photons are absorbed within the depletion region. FIG. 8C shows a series of photo-generated current pulses produced by a typical photodetector as a function of time if photons are absorbed outside the depletion region, in which case the response to an optical pulse may have a diffusion tail.

Figure 9:
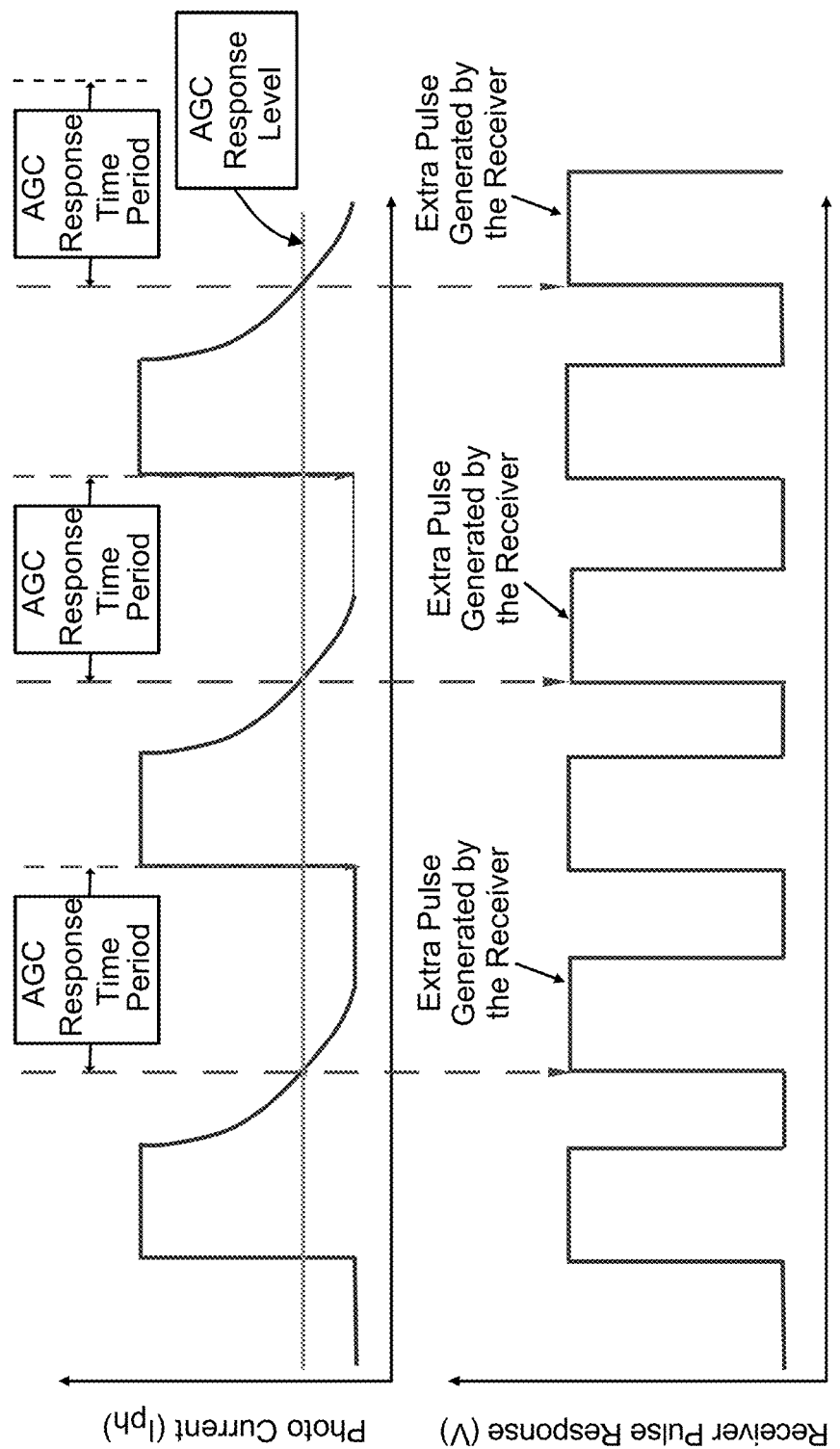
FIG. 9 includes upper and lower graphs that respectively show photo-generated current pulses and receiver current pulse responses (including extra pulses) as a function of time.

FIG. 9 includes upper and lower graphs that respectively show the detector photo-generated current pulses and receiver pulse responses (including extra pulses) as a function of time. The aforementioned receiver AGC is designed to trigger a response at a certain level (indicated by the horizontal line in the upper graph of FIG. 9) below the start of an optical signal pulse. The long "diffusion tail" is detected by the AGC at the AGC's trigger time and causes the receiver to output extra response pulses (in voltage), such as the response pulses depicted in the lower graph in FIG. 9.

The upper graph in FIG. 9 shows the same photo-generated current pulses as were depicted in FIG. 8C, but relative to various parameters of an automatic gain control circuit incorporated in some COTS receivers (i.e., AGC response time period and AGC response level), while the lower graph shows a series of receiver response pulses (caused by extra current pulses of the detector) that may be produced by a COTS receiver as a function of time in response to the photo-generated current (from the detector) with diffusion tails depicted in FIG. 8C.

Figure 10:
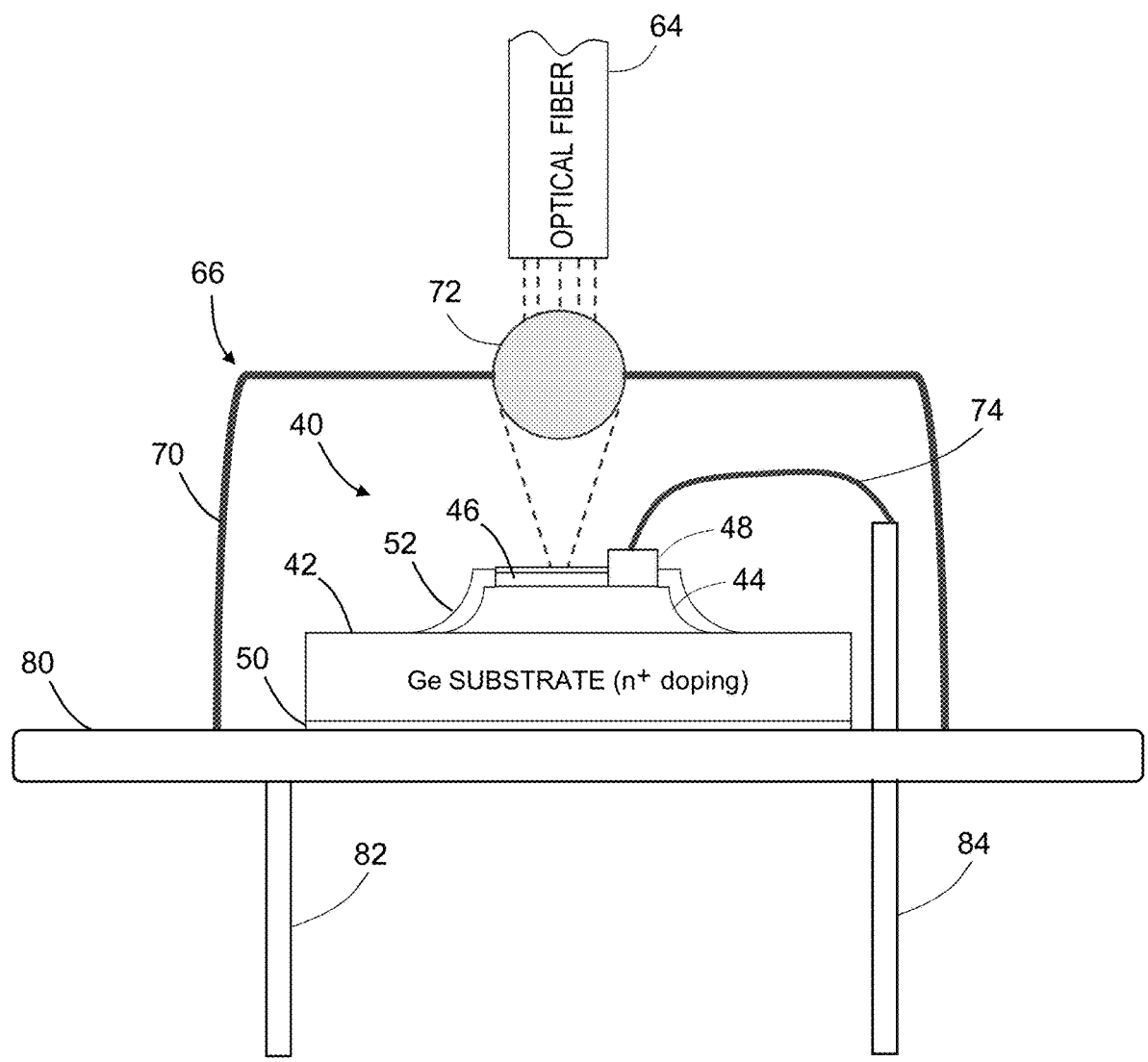
FIG. 10 is a diagram showing a germanium Schottky barrier photodetector installed in a hermetically sealed package with a glass ball lens using a two-pin configuration.

The germanium Schottky-barrier photodetector 40 disclosed herein may be packaged in various ways. FIG. 10 shows the photodetector packaged in a hermetically sealed metal can 66 (e.g., a transistor outline (TO) package such as TO-18 or TO-46) having a base 80, a lens cap 70 (also called a "lid") supported by the base 80, and 2-mm-diameter glass ball lens 72 (made, e.g., of BK7 glass) which is installed in an opening on the top of the lens cap 70. As seen in FIG. 10, the end of the optical fiber 64, the glass ball lens 72 and the metal film 46 are aligned with each other. Ideally, if the end face of the optical fiber 64 and metal film 46 are circular and the glass ball lens 72 is spherical, then the centers of the circles and the sphere will be collinear. Photons exiting the optical fiber 64 pass through the glass ball lens 72 and then impinge on the metal film 46, the result maximizes the photo-generated current of the detector. In accordance with one proposed implementation, the metal film 46 is positioned at the back focal length of the glass ball lens 72.

Two electrical leads for the photodetector package are required. One lead (detector front contact pin 84 which is insulated from the package base 80) is electrically connected to the metal pad 48 on the surface of the germanium Schottky-barrier photodetector 40 by bonding one end of a wire 74 to the metal pad 48 and the other end of the wire 74 to the detector front contact pin 84. The other lead (detector back contact pin 82) is connected to the base 80 of the metal case 66 for grounding. The photodetector backside ohmic contact metal layer 50 is bonded to the base 80 of the metal case 66. Therefore, the detector back contact pin 82 is also making contact with the back side of the photodetector.

Figure 11:
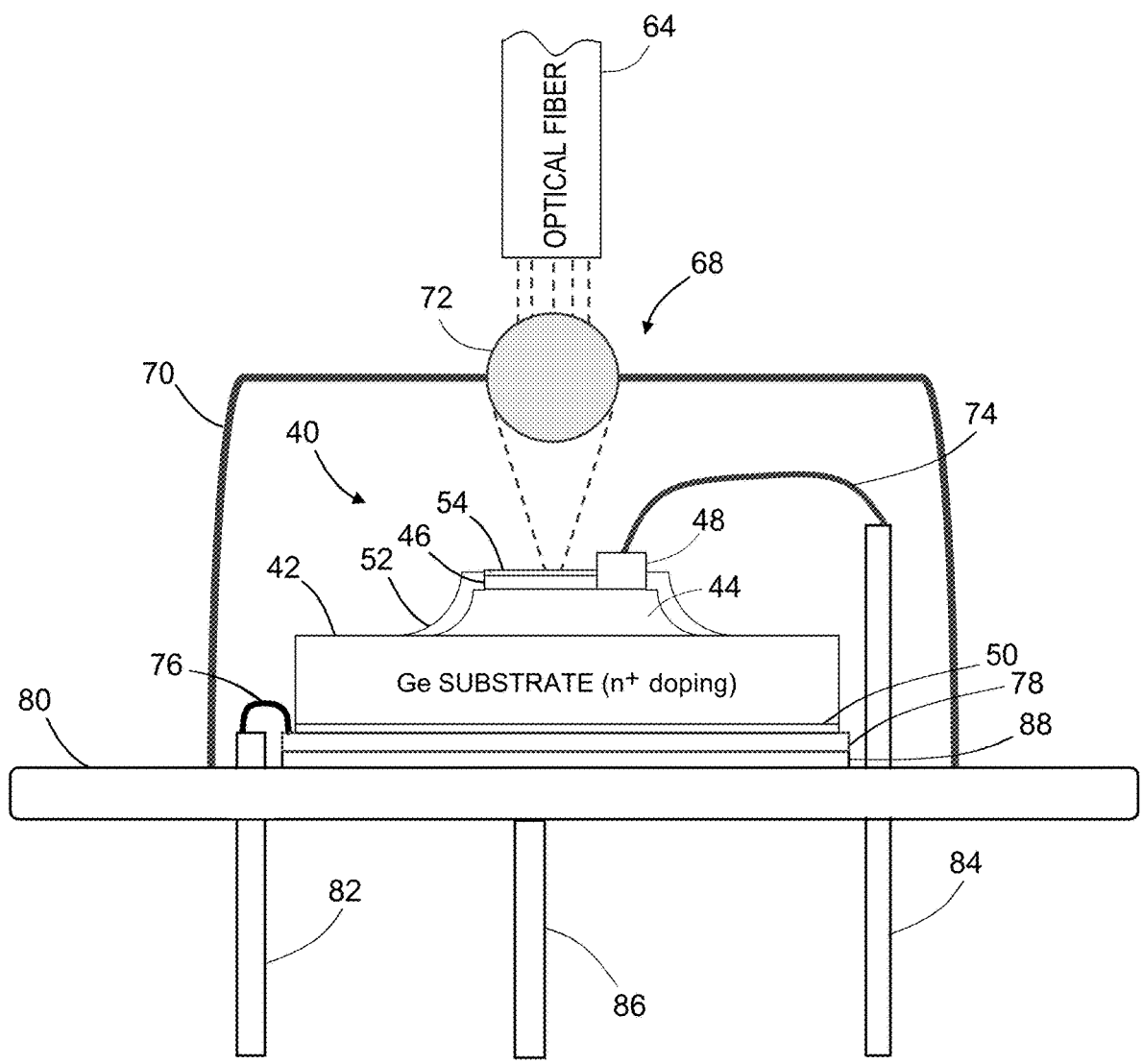
FIG. 11 is a diagram showing a germanium Schottky barrier photodetector installed in a hermetically sealed package with a glass ball lens using a three-pin configuration.

If an application requires the photodetector to be fully insulated from the package, a three-lead TO can package may be employed. FIG. 11 shows the germanium Schottky-barrier photodetector 40 packaged in a hermetically sealed metal case 68 using a three-pin configuration. This accomplished by putting an insulation layer 88 (a layer made of insulation material) and a metal layer 78 (a layer made of metal) below the back of the photodetector. The metal layer 78 is in contact with the ohmic contact metal layer 50 of the photodetector. The insulation layer 88 electrically isolates the metal layer 78 from the base 80. The metal layer 78 is then electrically connected to the detector back contact pin 82 (insulated from package base 80) by bonding opposite ends of a wire 76. The ground pin 86 is in contact with the base 80 of the metal case 68 for the purpose of grounding.

Since the germanium Schottky-barrier photodetector 40 disclosed herein is designed for use with optical fibers of diameters ranging from 8 microns to 1 mm, the optimized diameter is calculated to be about 550 microns. Therefore using a 2-mm-diameter glass ball lens 72 on the lens cap 70, with the photodetector positioned at a distance equal to about the back focal length of the glass ball lens 72, will optimize the optical coupling of optical fibers ranging from 8 microns to 1 mm in diameter.

As previously mentioned, germanium Schottky barrier photodetectors of the type disclosed herein may be employed in a fiber optic network onboard an airplane. One embodiment of such fiber optic network for enabling optical communication between line replaceable units on an airplane will now be described in some detail below for the purpose of illustration. However, use of germanium Schottky barrier photodetectors of the type disclosed herein is not limited solely to the environment of an airplane, but rather may be utilized in fiber optic networks onboard other types of vehicles or other types of fiber optic networks (e.g., long-distance terrestrial, data center, Internet of Things and fiber-to-the-home/office applications).

Figure 12:
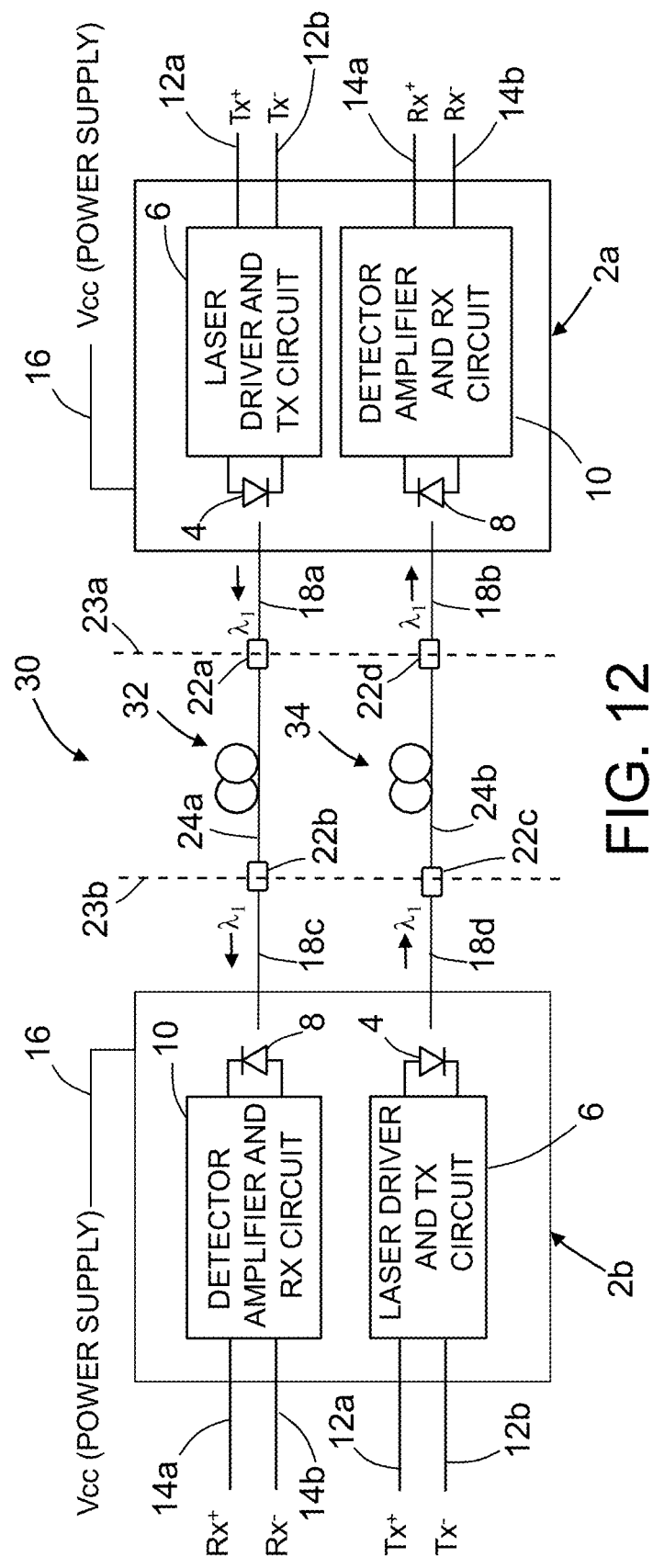
FIG. 12 is a diagram showing some components and identifying some features of an optical data transmission system that includes germanium Schottky barrier photodetectors of the type disclosed herein.

FIG. 12 is a diagram identifying some features of a bidirectional full-duplex data transmission system 30 comprising one pair of dual-fiber bidirectional transceivers 2a and 2b that each transmit and receive light of the same wavelength, Each of the single-wavelength dual-fiber bidirectional transceivers 2a and 2b includes a laser 4 and a photodetector 8. In this example, each photodetector 8 is a germanium Schottky barrier photodetector of the type depicted in FIG. 3. The laser 4 is driven to emit light of a wavelength $\lambda_1$ by a laser driver and transmit circuit 6 in response to receipt of differential transmit signals Tx$^+$ and Tx$^-$ from an associated line replaceable unit (not shown) via transmit electrical signal lines 12a and 12b respectively. The laser driver and transmit circuit 6 comprises electrical circuitry that converts those electrical differential signals to electrical digital signals representing the data to be transmitted by the laser 4. Conversely, the photodetector 8 receives light of wavelength $\lambda_1$ and converts that detected light into electrical digital signals which are provided to a detector amplifier and receive circuit 10. The detector amplifier and receive circuit 10 in turn comprises electrical circuitry that converts those electrical digital signals to electrical differential receive signals Rx$^+$ and Rx$^-$ representing the data received. The electrical differential receive signals Rx$^+$ and Rx$^-$ are transmitted to other circuitry in the line replaceable unit (not shown in the drawings) via receive electrical signal lines 14a and 14b respectively. The single-wavelength dual-fiber bidirectional transceiver 2 receives electrical power having a voltage Vcc via transceiver power supply line 16.

In the example depicted in FIG. 12, the laser 4 of the single-wavelength dual-fiber bidirectional transceiver 2a is optically coupled to emit light toward the photodetector 8 of the single-wavelength dual-fiber bidirectional transceiver 2b via an optical cable 32 comprising an optical fiber jumper 18a, a connector 22a mounted at a patch panel 23a, a plastic or glass optical fiber 24a, a connector 22b mounted at a patch panel 23b and an optical fiber jumper 18c connected in series. Similarly, the laser 4 of the single-wavelength dual-fiber bidirectional transceiver 2b is optically coupled to emit light toward to the photodetector 8 of the single-wavelength dual-fiber bidirectional transceiver 2a via an optical cable 34 comprising an optical fiber jumper 18d, a connector 22c mounted on patch panel 23b, a plastic or glass optical fiber 24b, a connector 22d mounted on patch panel 23a and an optical fiber jumper 18b connected in series. Both single-wavelength dual-fiber bidirectional transceivers 2a and 2b transmit and receive light having a wavelength $\lambda_1$. The optical cables 32 and 34 may be identical in construction. Optionally, optical fibers 24a and 24b may be GbPOF to enable bidirectional full-duplex data transmission at a high data rate (>1 Gbits/sec).

In addition to the application shown in FIG. 12, the universal broadband fiber optic photodetector disclosed herein has other avionics applications. The disclosed photodetector eliminates the need for multiple photodetectors and receivers in a single or multiple avionics platforms, and simplifies the parts management and inventory process for airplane, military system and sensor system applications. In addition, the design of the photodetector has superior operating characteristics and eliminates the APP problem in COTS receivers.

While germanium Schottky barrier photodetectors and processes for fabricating such photodetectors have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

The method claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the process claims be construed to exclude any portions of two or more steps being performed concurrently or alternatingly unless the claim language explicitly states a condition that precludes such an interpretation.

The invention claimed is:

1. A photodetector comprising:
a substrate made of doped germanium;
a mesa structure made of doped epitaxial germanium grown on top of the substrate, wherein a doping density of the doped epitaxial germanium is less than a doping density of the doped germanium;
a metal film made of metal deposited on top of the mesa structure;
a metal pad made of metal deposited on top of the mesa structure and in contact with the film; and
an ohmic contact layer made of metal deposited on a bottom of the substrate,
wherein the doped germanium and the doped epitaxial germanium are doped with n-type dopant.

2. The photodetector as recited in claim 1, wherein the metal film and metal pad are made of a metal selected from the following group: gold, silver, aluminum, copper and indium.

3. The photodetector as recited in claim 2, wherein the metal film and the mesa structure form a junction having a Schottky barrier height in a range of 0.54 to 0.64 volts.

4. The photodetector as recited in claim 1, further comprising a voltage source connected to the metal pad and the ohmic contact layer, wherein the metal film and the mesa structure are configured to produce a depletion region in the mesa structure and adjacent the metal film, the depletion region having a width that increases when a reverse bias voltage is applied by the voltage source during impingement of photons on the metal film.

5. The photodetector as recited in claim 4, wherein the metal film has a diameter in a range of 450 to 600 microns.

6. The photodetector as recited in claim 4, wherein the effective Richardson constant is in a range of 128 to 135 A/cm$^2$-° K$^2$.

7. The photodetector as recited in claim 1, further comprising an anti-reflective coating deposited on the film.

8. The photodetector as recited in claim 1, further comprising a dielectric passivation layer that covers exposed surfaces of the mesa structure.

9. A fiber optic device comprising:
an optical fiber having an end;
a hermetic metal case comprising a base, a lens cap attached to the base and a glass ball lens installed in an opening on a top of the lens cap; and
a photodetector disposed inside the metal case, the photodetector comprising a substrate made of doped germanium, a mesa structure made of low doped epitaxial germanium grown on top of the substrate, a doping density of the doped epitaxial germanium being much less than a doping density of the doped germanium, a metal film made of metal deposited on top of the mesa structure, a metal pad made of metal deposited on top of the mesa structure and in contact with the film, and an ohmic contact layer made of metal deposited on a bottom of the substrate,
wherein the optical fiber, glass ball lens and metal film are aligned, and
wherein the doped germanium and the doped epitaxial germanium are doped with n-type dopant.

10. The fiber optic device as recited in claim 9, wherein the metal film and metal pad are made of a metal selected from the following group: gold, silver, aluminum, copper and indium.

11. The fiber optic device as recited in claim 9, wherein the metal film and the mesa structure form a junction having a Schottky barrier height in a range of 0.54 to 0.64 volts.

12. The fiber optic device as recited in claim 9, wherein the metal film and the mesa structure are configured to produce a depletion region in the mesa structure and adjacent to the metal film, the depletion region having a width that increases when a reverse bias voltage is applied across the metal pad and ohmic contact metal layer during impingement of photons on the metal film.

13. The fiber optic device as recited in claim 9, wherein the metal film has a diameter in a range of 450 to 600 microns and the glass ball lens has a diameter of 2 mm.

14. The fiber optic device as recited in claim 13, wherein the metal film is positioned at a back focal length of the glass ball lens.

15. The fiber optic device as recited in claim 9, further comprising:
a metal layer in contact with the ohmic contact metal layer; and
an insulation layer that electrically isolates the metal layer from the base.

16. The fiber optic device as recited in claim 9, wherein the photodetector further comprises a dielectric passivation layer that covers exposed surfaces of the mesa structure.

17. A method for fabricating a photodetector, the method comprising:
polishing and lapping a doped germanium wafer until a germanium substrate having a thickness in the range of 100 to 150 microns is formed;
growing a doped germanium epitaxial layer about 15 microns thick on top of the germanium substrate;
depositing an ohmic contact metal layer on a bottom of the germanium substrate;
depositing a metal film and a metal pad on top of the germanium epitaxial layer such that the metal pad is in contact with the metal film;
forming a mesa structure by removing some of the germanium epitaxial layer; and
depositing a dielectric passivation layer on exposed surfaces of the mesa structure,
wherein the doped germanium and the doped epitaxial germanium are doped with n-type dopant.

18. The method as recited in claim 17, further comprising depositing an anti-reflective coating on top of the metal film.

19. The method as recited in claim 17, wherein the metal film and metal pad are made of a metal selected from the following group: gold, silver, aluminum, copper and indium.

20. The method as recited in claim 17, wherein a top surface of the mesa structure has a diameter in a range of 450 to 600 microns.

* * * * *